(12) United States Patent
Yang et al.

(10) Patent No.: US 9,478,487 B2
(45) Date of Patent: Oct. 25, 2016

(54) SEMICONDUCTOR PACKAGE

(71) Applicants: Byeong-Wan Yang, Hwaseong-si (KR); Sunghoon Kim, Seongnam-si (KR)

(72) Inventors: Byeong-Wan Yang, Hwaseong-si (KR); Sunghoon Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/639,305

(22) Filed: Mar. 5, 2015

(65) Prior Publication Data

US 2016/0043026 A1 Feb. 11, 2016

(30) Foreign Application Priority Data

Aug. 11, 2014 (KR) ........................ 10-2014-0103781

(51) Int. Cl.
*H01L 23/58* (2006.01)
*H01L 23/498* (2006.01)
*H01L 21/66* (2006.01)
(Continued)

(52) U.S. Cl.
CPC ......... *H01L 23/49838* (2013.01); *H01L 22/32* (2013.01); *H01L 23/49811* (2013.01); *H01L 23/49827* (2013.01); *H01L 25/0657* (2013.01); *H01L 23/522* (2013.01); *H01L 24/05* (2013.01); *H01L 24/06* (2013.01); *H01L 24/32* (2013.01); *H01L 24/48* (2013.01); *H01L 24/49* (2013.01); *H01L 24/73* (2013.01); *H01L 2224/04042* (2013.01); *H01L 2224/05078* (2013.01); *H01L 2224/05554* (2013.01); *H01L 2224/05567* (2013.01); *H01L 2224/06135* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/49175* (2013.01); *H01L 2224/73265* (2013.01); *H01L 2225/0651* (2013.01); *H01L 2225/06506* (2013.01); *H01L 2225/06562* (2013.01); *H01L 2225/06596* (2013.01); *H01L 2924/1434* (2013.01); *H01L 2924/1438* (2013.01)

(58) Field of Classification Search
CPC .................. H01L 23/49838; H01L 23/49811; H01L 25/074; H01L 23/49827
USPC ..................................... 257/48, 459, E23.02
See application file for complete search history.

(56) References Cited

U.S. PATENT DOCUMENTS

| | | | |
|---|---|---|---|
| 6,598,532 B2 | 7/2003 | Gerard et al. | |
| 6,847,576 B2 | 1/2005 | Kang | |

(Continued)

FOREIGN PATENT DOCUMENTS

| | | |
|---|---|---|
| JP | 2001007278 A | 1/2001 |
| JP | 2013026346 | 2/2013 |

(Continued)

*Primary Examiner* — Tan N Tran
(74) *Attorney, Agent, or Firm* — Volentine & Whitt, PLLC

(57) ABSTRACT

A semiconductor package includes a substrate including connection pads, a first semiconductor, and conductive wires. The first semiconductor chip is stacked on the substrate and includes bonding pads, non-bonding pads, and a routing area that is provided adjacent a center of an edge of the first semiconductor chip. The conductive wires are connected to the bonding pads and the connection pads. The bonding pads are disposed to form at least one column in a direction extending along the edge of the first semiconductor chip and are not disposed in the routing area. The non-bonding pads are disposed to form a column different from the at least one column formed by the bonding pads.

20 Claims, 8 Drawing Sheets

(51) Int. Cl.
   *H01L 25/065*   (2006.01)
   *H01L 23/522*   (2006.01)
   *H01L 23/00*   (2006.01)

(56) References Cited

U.S. PATENT DOCUMENTS

| | | | |
|---|---|---|---|
| 7,994,621 | B2 | 8/2011 | Kim |
| 8,368,197 | B2 | 2/2013 | Kook |
| 2007/0206399 | A1* | 9/2007 | Makino .................. G11C 5/025 365/63 |
| 2010/0181661 | A1* | 7/2010 | Takemoto ............... H01L 24/24 257/686 |
| 2011/0298128 | A1 | 12/2011 | Schuetz |
| 2012/0056178 | A1 | 3/2012 | Han et al. |
| 2014/0203443 | A1* | 7/2014 | Pagaila ................. H01L 21/568 257/773 |

FOREIGN PATENT DOCUMENTS

| | | |
|---|---|---|
| KR | 1020040066998 A | 7/2004 |
| KR | 100463202 | 12/2004 |
| KR | 100512159 B1 | 8/2005 |
| KR | 1020090049442 A | 5/2009 |
| KR | 1020090113679 A | 11/2009 |
| KR | 1020110032711 A | 3/2011 |
| KR | 1020120024099 A | 3/2012 |
| KR | 1020130079093 A | 7/2013 |
| KR | 1020140028209 A | 3/2014 |

\* cited by examiner

SEMICONDUCTOR PACKAGE

CROSS-REFERENCE TO RELATED APPLICATIONS

A claim of priority under 35 U.S.C. §119 is made to Korean Patent Application No. 10-2014-0103781, filed on Aug. 11, 2014, in the Korean Intellectual Property Office, the entire contents of which are hereby incorporated by reference.

BACKGROUND

The inventive concept herein relates to a semiconductor package, and more particularly, to a semiconductor package including a semiconductor chip.

In a semiconductor industry, continued demands for increased operational capacities and higher levels of device integration have lead led to smaller and thinner semiconductor chips and miniaturization of electronics contained in semiconductor chips. As a result, various package technologies have been developed to accommodate desired device compactness. One such package technology involves vertically stacking multiple semiconductor chips to implement a package having high-density chip stacking. This technology can reduce a footprint of the device relative to a single semiconductor chip with comparable functionality.

A semiconductor chip generally includes a plurality of pads having various functions and wirings connected to the pads. The wirings connected to the pads extend in a specific direction and may thus be dense at the center of the semiconductor chip. In this case, due to the arrangement of the pads, there may be a lack of space in which the wirings may be disposed. This can be especially problematic when stacking the chip on a substrate or another chip.

SUMMARY

According to embodiments of the inventive concept, a semiconductor package may include a substrate including connection pads, and a first semiconductor chip stacked on the substrate. The first semiconductor chip may include a first side, bonding pads disposed adjacent to the first side, a routing area that is provided between the bonding pads and in which a routing wiring is disposed, and non-bonding pads adjacent to the bonding pads. Conductive wires may be connected to the bonding pads and the connection pads. The bonding pads may be arranged to form at least one column along the first side of the first semiconductor chip, and the non-bonding pads may be arranged to form a column different from the at least one column formed by the bonding pads and are not in contact with the conductive wire.

In some embodiments, the non-bonding pads may be electrically connected to an integrated circuit in the semiconductor chip to receive or output a test signal for testing the integrated circuit.

In some embodiments, the semiconductor packages may further include a second semiconductor chip stacked on the first semiconductor chip in a form of a cascade, wherein the second semiconductor chip may expose the bonding pads and cover at least a portion of the non-bonding pads.

In some embodiments, the non-bonding pads may include an internal non-bonding pad; and an external non-bonding pad disposed between the internal non-bonding pad and the bonding pads, wherein the second semiconductor chip may fully cover the internal non-bonding pad and cover a portion of the external non-bonding pad.

In some embodiments, the semiconductor packages may further include a second semiconductor chip stacked on the first semiconductor chip in a form of a cascade, wherein the second semiconductor chip may expose the bonding pads and may fully cover the non-bonding pads In some embodiments, the non-bonding pads may be arranged to form at least one column along a second side of the first semiconductor chip, the second side being perpendicular to the first side of the first semiconductor chip.

In some embodiments, the non-bonding pads may further be arranged to form at least one column along a third side of the first semiconductor chip, the third side being parallel and opposite to the second side of the first semiconductor chip and perpendicular to the first side of the first semiconductor chip.

In some embodiments, each of the bonding pads may include a first metal layer, a second metal layer disposed on the first metal layer, and a via pattern electrically connecting the first metal layer to the second metal layer.

In some embodiments, each of the bonding pads may further include a protection portion disposed under the first metal layer, and the protection portion may include a gate conducting layer, a third metal layer disposed on the gate conducting layer, and a metal contact connecting the gate conducting layer to the third metal layer.

In some embodiments, at least one of the non-bonding pads may include a fourth metal layer, the fourth metal layer may be formed of a same material as the second metal layer and disposed on a same level as the second metal layer, and a metal material may not be disposed under the fourth metal layer.

In some embodiments, the first semiconductor chip may further include a memory cell area in which a non-volatile memory is disposed, and a peripheral circuit area in which circuits for operating the non-volatile memory are disposed.

In some embodiments, the bonding pads and the non-bonding pads may be disposed in the peripheral circuit area.

In some embodiments, the non-volatile memory may be a vertical NAND (VNAND) flash memory including memory cells that are vertically stacked on one another to form a three-dimensional cell array structure.

According to embodiments of the inventive concept, a semiconductor package may include a substrate including connection pads, and a first semiconductor chip stacked on the substrate. The first semiconductor chip may include bonding pads, non-bonding pads, and a routing area that is provided adjacent to a center of an edge of the first semiconductor and in which a routing wiring is disposed. Conductive wires may be connected to the bonding pads and the connection pads. The bonding pads may be arranged to form at least one column in a direction extending along the edge of the first semiconductor chip and to have no overlap with the routing area, and the non-bonding pads may not be connected to the conductive wires and may be arranged to form a column in a direction which different from that of the at least one column formed by the bonding pads.

In some embodiments, the non-bonding pads may receive or output a test signal.

In some embodiments, the first semiconductor chip may have a quadrilateral shape having sides extending in a first direction and a second direction perpendicular to the first direction and the edge of the first semiconductor chip may be one of the sides extending in the first direction.

In some embodiments, the non-bonding pads may be arranged along the sides of the first semiconductor extending in the second direction.

According to embodiments of the inventive concept, a semiconductor package may include a substrate comprising connection pads, a first semiconductor chip stacked on the substrate, and a second semiconductor chip stacked on the first semiconductor chip in a form of a cascade. The first semiconductor chip may include a first routing area that is provided adjacent a center of an edge of the first semiconductor chip and in which a routing wiring is disposed, first bonding pads that are disposed to form at least one column in a first direction extending along the edge and to have no overlap with the first routing area, and first non-bonding pads that are disposed to form a column which is different from the at least one column of the first bonding pads. Conductive wires may be connected to the first bonding pads and the connection pads. The second semiconductor chip may expose the first bonding pads and the first routing area, and the second semiconductor chip may expose a portion of the first non-bonding pads or fully covers the first non-bonding pads.

In some embodiments. the second semiconductor chip may include a second routing area that is provided adjacent a center of the edge of the semiconductor chip and in which a routing wiring is disposed, second bonding pads that are disposed to form at least one column in the first direction and to have no overlap with the second routing area, and second non-bonding pads that are disposed to form a column which is different from the at least one column formed by the second bonding pads.

In some embodiments, the first non-bonding pads may be not connected to the conductive wires, and may receive or output a test signal for testing an integrated circuit.

BRIEF DESCRIPTION OF THE DRAWINGS

The accompanying drawings are included to provide a further understanding of the inventive concept, and are incorporated in and constitute a part of this specification. The drawings illustrate example embodiments of the inventive concept and, together with the description, serve to explain principles of the inventive concept. In the drawings.

DETAILED DESCRIPTION OF THE EMBODIMENTS

Figure 1:
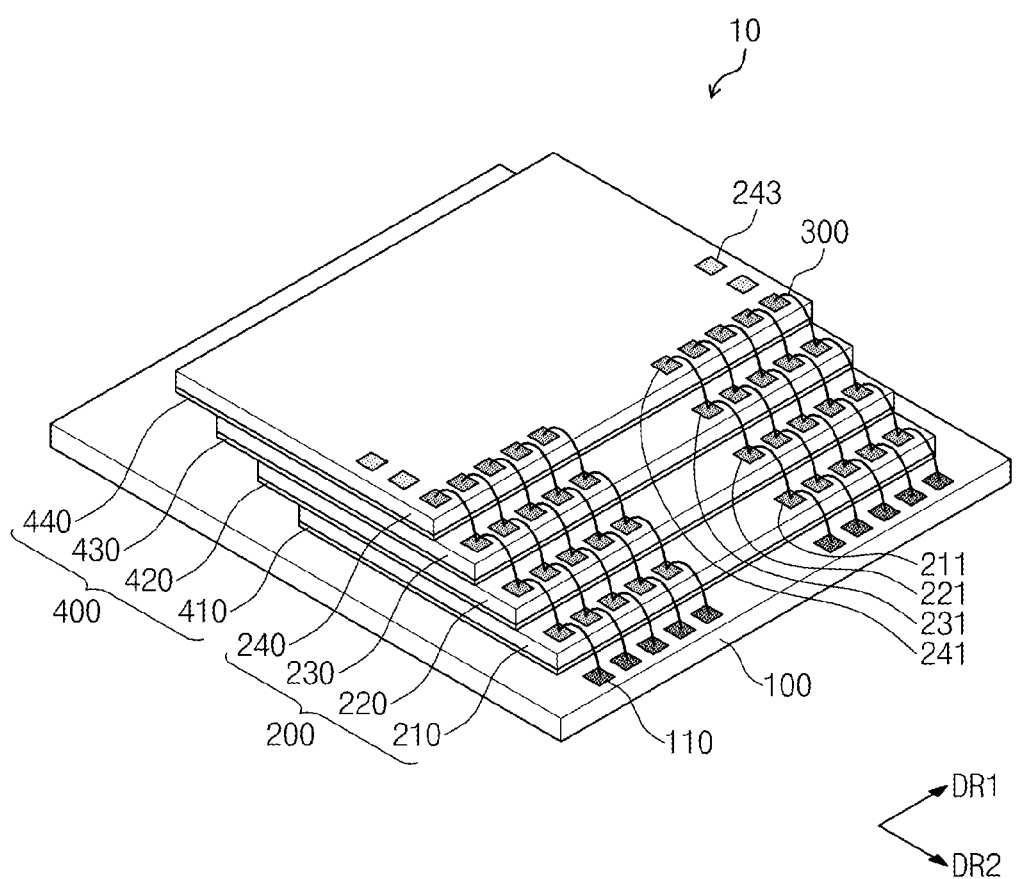
FIG. 1 is a perspective view of a semiconductor package according to an embodiment of the inventive concept.

Advantages and features of the inventive concept and methods of accomplishing the same may be understood more readily by reference to the following detailed description of various embodiments and the accompanying drawings. The inventive concept may, however, be embodied in many different forms and should not be construed as being limited to the embodiments set forth herein. Like reference numerals refer to like elements throughout the specification.

In the specification, it will be understood that when a component is referred to as being "on" another component, it can be directly on the other component, or an intervening component may also be present. Also, in the figures, the dimensions of components are exaggerated for clarity of illustration.

Embodiments will be described with cross-sectional views that may be ideal views of these embodiments. Also, in the figures, dimensions of layers and regions may be exaggerated for clarity of illustration. Accordingly, shapes of the views may be modified according to manufacturing techniques and/or allowable errors. Therefore, embodiments of the inventive concept are not limited to the specific shape illustrated in the views, but may include other shapes that may be created according to manufacturing processes. It will be understood that although the terms first and second are used herein to describe various elements, these elements should not be limited by these terms. These terms are only used to distinguish one element from another element. An embodiment described and illustrated herein may include a complementary embodiment thereof.

In the following description, the technical terms are used only for explaining specific example embodiments while not limiting the present inventive concept. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, some embodiments will be described in detail with reference to the accompanying drawings.

Figure 2:
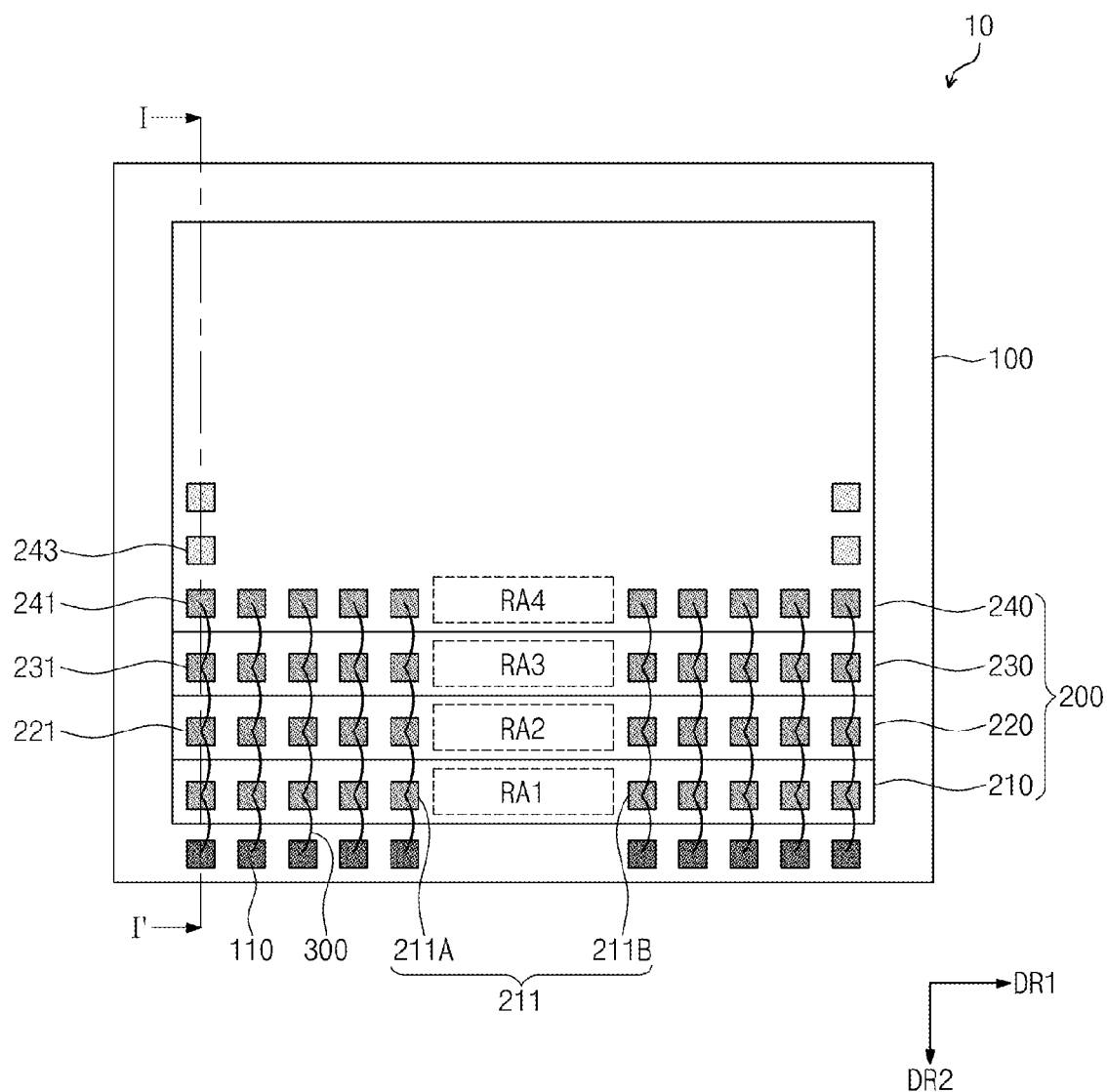
FIG. 2 is a plan view of the semiconductor package of FIG. 1.
Figure 3:
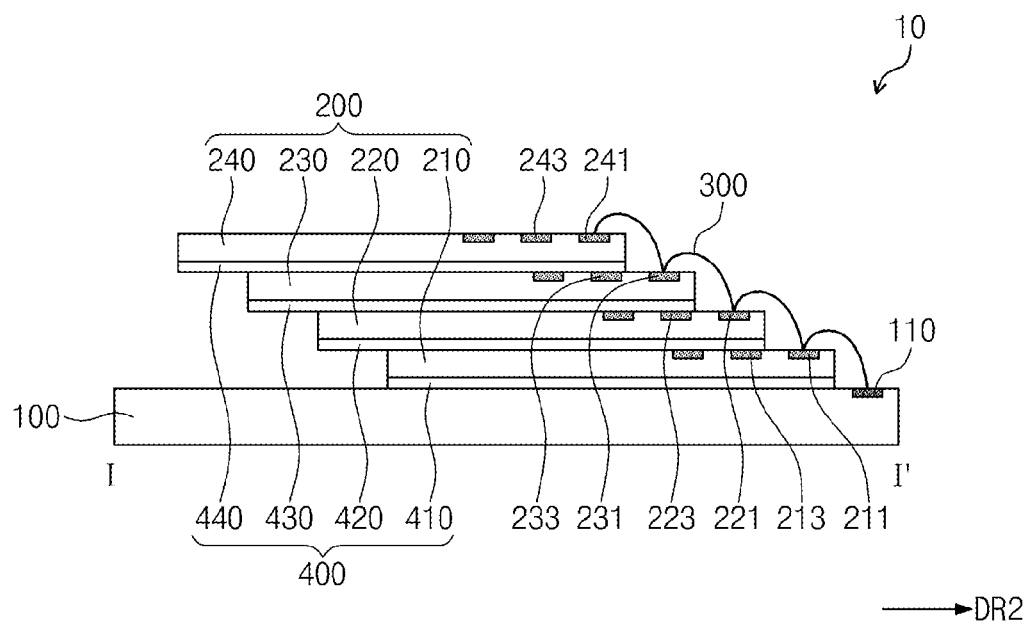
FIG. 3 is a cross-sectional view taken along line I-I' in FIG. 2.
Figure 4:
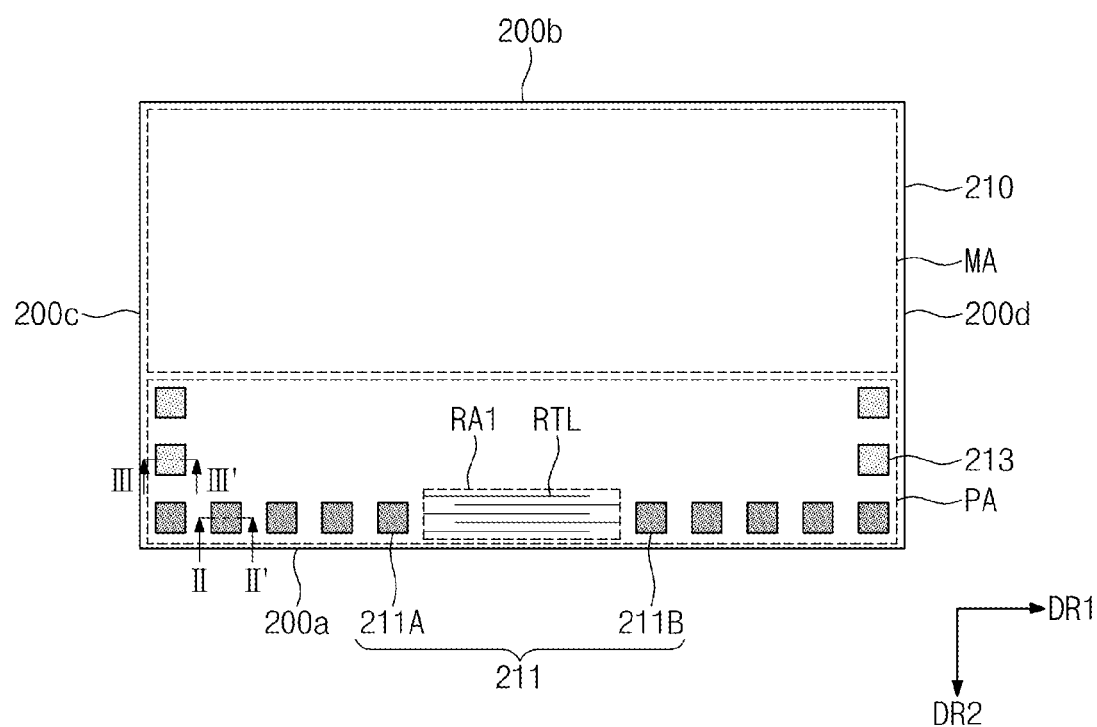
FIG. 4 is a plan view of a first semiconductor chip in the semiconductor package of FIG. 1.

FIG. 1 is a perspective view of a semiconductor package according to an embodiment of the inventive concept, FIG. 2 is a plan view of the semiconductor package of FIG. 1, FIG. 3 is a cross-sectional view taken along line I-I' in FIG. 2, and FIG. 4 is a plan view of a first semiconductor chip in the semiconductor package of FIG. 1.

Referring to FIGS. 1 to 4, a semiconductor package 10 may include a substrate 100, a semiconductor chip 200, and conductive wires 300.

The substrate 100 may have a plate shape. For example, the substrate 100 may have a quadrilateral shape when viewed in plan view. The substrate 100 may include two sides extending in a first direction DR1 and two sides extending in a second direction DR2. The first direction DR1 may be perpendicular to the second direction DR2. The substrate 100 may be, for example, a printed circuit board (PCB). The substrate 100 may include a plurality of connection pads 110.

The semiconductor chip 200 may include first to fourth semiconductor chips 210 to 240.

The first to fourth semiconductor chips 210 to 240 may be sequentially stacked in a form of a cascade on the substrate 100. For example, the first to fourth semiconductor chips 210 to 240 may be stacked in forms of steps to expose portions of upper surfaces thereof. In the following embodiment, although it is described that the semiconductor chip 200 includes four semiconductor chips, first to fourth semiconductor chips 210 to 240, the inventive concept is not limited thereto and the semiconductor chip 200 may include five or more semiconductor chips, or three or less semiconductor chips. Also, when a plurality of stacked semiconductor chips are defined as a chip stack, the semiconductor chip 200 may include a plurality of chip stacks.

Each of the first to fourth semiconductor chips 210 to 240 may have a quadrilateral shape when viewed from plan view. Each of the first to fourth semiconductor chips 210 to 240 may include first and second sides 200a and 200b extending in the first direction DR1 and third and fourth sides 200c and 200d extending in the second direction DR2.

The semiconductor package 10 may further include an adhesive layer 400. The adhesive layer 400 may attach the first to fourth semiconductor chips 210 to 240 to one another and also attach the first semiconductor chip 210 and the substrate 100 to each other.

The adhesive layer 400 may include first to fourth adhesive layers 410 to 440. The first adhesive layer 410 may be provided between the substrate 100 and the first semiconductor chip 210. The second adhesive layer 420 may be provided between the first semiconductor chip 210 and the second semiconductor chip 220. The third adhesive layer 430 may be provided between the second semiconductor chip 220 and the third semiconductor chip 230. The fourth adhesive layer 440 may be provided between the third semiconductor chip 230 and the fourth semiconductor chip 240.

The first semiconductor chip 210 may include a first routing area RA1, first bonding pads 211 and first non-bonding pads 213.

The first routing area RA1 may be provided at the center of an edge of the first semiconductor chip 210 parallel to the first direction DR1. For example, the first routing area RA1 may be disposed adjacent to the center of the first side 200a. The first routing area RA1 may be an area that routing wirings RTL disposed therein to electrically connect the first bonding pads 211 to an integrated circuit of the first semiconductor chip 210.

Some of first bonding pads 211 may be electrically connected to other first bonding pads 211 that are adjacent thereto. Some of the first bonding pads 211 may be electrically connected to the integrated circuit of the first semiconductor chip 210 to provide the integrated circuit with a signal. Some other of the first bonding pads 211 may not be electrically connected to the integrated circuit of the first semiconductor chip 210 and be dummy pads for decreasing the lengths of the conductive wires 300.

The first bonding pads 211 may be arranged to form at least one column along an edge of the first semiconductor chip 210 parallel to the first direction DR1. The first bonding pads 211 may be arranged to form at least one column along the first side 200a of the first semiconductor chip 210 parallel to the first direction DR1. In FIGS. 1 to 3, the first bonding pads 211 are arranged to form one column in the first direction DR1, for example. The first bonding pads 211 may not overlap with the first routing area RA1 but expose the first routing area RA1. The first bonding pads 211 may not be disposed on the first routing area RA1.

The first bonding pads 211 may include first sub bonding pads 211A and second sub bonding pads 211B. The first sub bonding pads 211A and the second sub bonding pads 211B may be disposed to face each other with the first routing area RA1 there between. The first sub bonding pads 211A may be disposed along the first side 200a adjacent to one side of the first routing area RA1 in the first direction DR1, and the second sub bonding pads 211B may be disposed along the first side adjacent of the other side of the first routing area RA1 in the first direction DR1. Although FIGS. 1 to 3 show that five first sub bonding pads 211A are provided and five second sub bonding pads 211B are provided, the inventive concept is not limited thereto and the numbers of the first sub bonding pads 211A and the second sub bonding pads 211B may vary. The distance between the first sub bonding pads 211A in the first direction DR1 may be the same as the distance between the second sub bonding pads 211B in the first direction DR1.

The first non-bonding pads 213 may be arranged to form a column different from the first bonding pads 211. The first non-bonding pads 213 may not be electrically connected to the first bonding pads 211. The first non-bonding pads 213 may be electrically connected to the integrated circuit of the first semiconductor chip 210 to test an operation of the integrated circuit. Thus, the first non-bonding pads 213 may receive or output a test signal for testing the integrated circuit.

The first non-bonding pads 213 may be disposed to be spaced apart from the first bonding pads 211 in the second direction DR2. The first non-bonding pads 213 may be arranged to form at least one column in the second direction DR2.

The first non-bonding pads 213 may be disposed along both sides of the first semiconductor chip 210 in the second direction DR2. For example, the first non-bonding pads 213 may be disposed along the third and fourth sides 200c and 200d of the first semiconductor chip 210 in the second direction DR2, but the inventive concept is not limited thereto. In some embodiments, the first non-bonding pads may be disposed along one of the third and fourth sides 200c and 200d. FIGS. 1 to 3 show that the first non-bonding pads 213 include two first non-bonding pads 213 disposed along one side of the first semiconductor chip 210 perpendicular to the first direction DR1 and two first non-bonding pads 213 disposed along the other side of the first semiconductor chip 210 perpendicular to the first direction DR1, for example. However, the inventive concept is not limited to numbers of the non-bonding pads 213 and the numbers of the non-bonding pads 213 may vary.

The first semiconductor chip 210 may further include a memory cell area MA and a peripheral circuit area PA. The memory cell area MA and the peripheral circuit area PA may be disposed to be adjacent to each other in the second direction DR2.

Non-volatile memory may be disposed in the memory cell area MA. The non-volatile memory may be a vertical NAND (VNAND) flash memory including memory cells that are vertically stacked on one another to form a 3D structure, or a planar NAND flash memory including memory cells that are 2-dimensionally formed.

Circuits for the operation of the non-volatile memory may be disposed in the peripheral circuit area PA. The circuits may include a control circuit, an address decoder, and an input and output circuit. The first routing area RA1 may be a portion of the peripheral circuit area PA or may overlap with the peripheral circuit area PA.

The first bonding pads 21 and the first non-bonding pads 213 may be disposed on the peripheral circuit area PA.

Each of the second to fourth semiconductor chips 220 to 240 may have the same structure as the first semiconductor chip 210.

The second semiconductor chip 220 may include a second routing area RA2, second bonding pads 221 and second non-bonding pads 223. The third semiconductor chip 230 may include a third routing area RA, third bonding pads 231 and third non-bonding pads 233. The fourth semiconductor chip 240 may include a fourth routing area RA4, fourth bonding pads 241 and fourth non-bonding pads 243.

Each of the second to fourth routing areas RA2 to RA4 may have the same arrangement as the first routing area RA1 in a corresponding one of the semiconductor chips 220 to 240.

Each of the second to fourth bonding pads 221 to 241 may have the same arrangement as the first bonding pads 211 in a corresponding one of the semiconductor chips 220 to 240.

Each of the second to fourth non-bonding pads 223 to 243 may have the same arrangement as the first non-bonding pads 213 in a corresponding one of the semiconductor chips 220 to 240.

The conductive wires 300 may electrically connect the substrate 100 to the first to fourth semiconductor chips 210 to 240.

The conductive wires 300 may be connected to the first to fourth bonding pads 211, 221, 231, and 241 and the connection pads 110. The conductive wires 300 may connect the connection pads 110 to the first bonding pads 211, the first bonding pads 211 to the second bonding pads 221, the second bonding pads 221 to the third bonding pads 231, and the third bonding pads 231 to the fourth bonding pads 241. The conductive wires 300 are not in contact with and are not connected to the first to fourth non-bonding pads 213, 223, 233 and 243.

The second semiconductor chip 220 is disposed on the first semiconductor chip 210. The second semiconductor chip 220 may expose the first bonding pads 211 of the first semiconductor chip 210 and may fully cover the first non-bonding pads 213. The first bonding pads 211 may be exposed to be connected to the conductive wires 300. However, the first non-bonding pads 213 may be only used in a test step after the formation of the first semiconductor chip 210, and may be no longer used in the semiconductor package 200 after stacking the first to fourth semiconductor chips 210 to 240 on the first semiconductor chip 210. Thus, even though the first non-bonding pads 213 are covered by the second semiconductor chip 220, there is no change in operation of the semiconductor package 200.

Similarly, the third semiconductor chip 230 may be disposed on the second semiconductor chip 220. The third semiconductor chip 230 may expose the second bonding pads 221 of the second semiconductor chip 220 and fully cover the second non-bonding pads 223.

The fourth semiconductor chip 240 may be disposed on the third semiconductor chip 230. The fourth semiconductor chip 240 may expose the third bonding pads 231 of the third semiconductor chip 230 and fully cover the third non-bonding pads 233.

The first to fourth semiconductor chips 210 to 240 may further include routing wirings RTL. The routing wirings RTL may be formed of the same material as the conductive layer (e.g., a second metal layer M2 in FIG. 5 and a fourth metal layer M4 in FIG. 6) of the first to fourth bonding pads 211 to 241, and may be located on the same level. The routing wirings RTL may electrically connect the first to fourth bonding pads 211 to 241 to the integrated circuits in each of the first to fourth semiconductor chips 210 to 240.

According to some embodiments, the routing wirings RTL may generally extend in the first direction DR1. However, the routing wirings RTL may also be folded or bent at a portion connected to the first to fourth bonding pads 211 to 241 in a direction other than the first direction DR1. Thus, the routing wirings RTL may be dense adjacent to the center of the first side 200a, parallel to the first direction DR1, of each of the first to fourth semiconductor chips 210 to 240.

Referring to the first semiconductor chip 210 in FIG. 4, it is difficult to secure the routing area RA1 when the first bonding pads 211 and the first non-bonding pads 213 are arranged in the same column. In an embodiment of the inventive concept, it is possible to secure the routing area RA1 including the routing wirings RTL by arranging the first non-bonding pads 213 in a column different from the first bonding pads 211.

Figure 5:
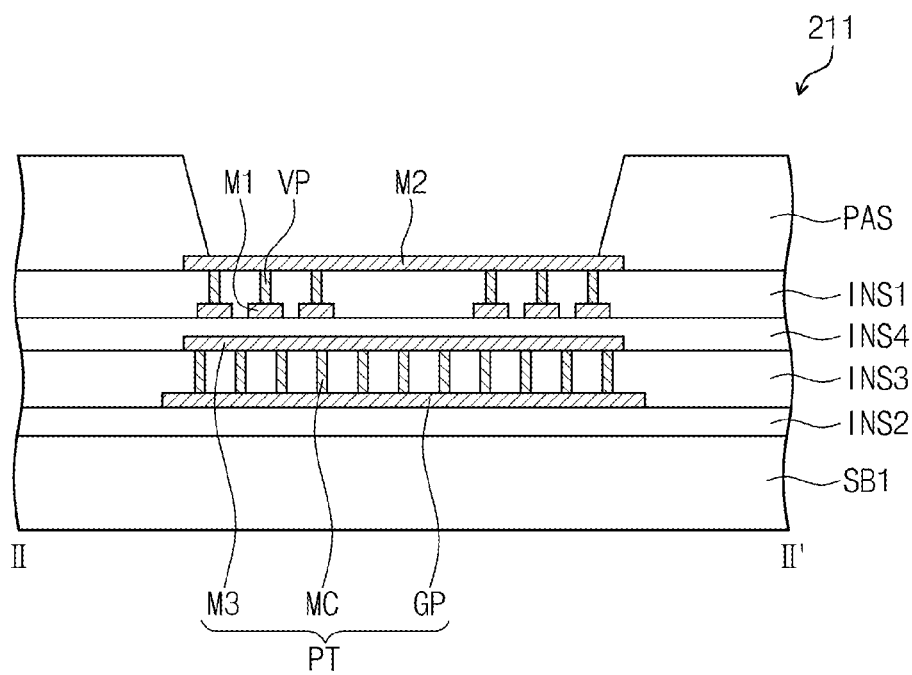
FIG. 5 is a cross-sectional view of a first bonding pad taken along line II-II' in FIG. 4.

FIG. 5 is a cross-sectional view of a first bonding pad taken along line II-II' in FIG. 4.

The first bonding pads 211 may have such a structure as shown in FIG. 5.

Referring to FIG. 5, each first bonding pad 211 may include a protection portion PT, a first metal layer M1, a via pattern VP, and a second metal layer M2 that are disposed on a semiconductor substrate SB1.

The first metal layer M1 may be disposed on the protection portion PT. The first metal layer M1 may transmit an applied signal to the second metal layer M2 or receive the signal applied to the second metal layer M2. For example, the first metal layer M1 may have a shape extending in the second direction DR2 (see FIG. 4). The first metal layer M1 may be formed of metal, such as copper or copper alloy.

A first insulating layer INS1 may be disposed on the first metal layer M1.

The second metal layer M2 may be disposed on the first insulating layer INS1. The second metal layer M2 may be electrically connected to other bonding pads 211 or an integrated circuit to receive or output a data signal. The second metal layer M2 may be formed of metal, such as aluminum or aluminum alloy.

The via pattern VP may pass through the first insulating layer INS1 to electrically connect the first metal layer M1 to the second metal layer M2. The via pattern VP may be formed of metal, such as tungsten or tungsten alloy.

A passivation layer PAS may be formed on the second metal layer M2 and the first insulating layer INS1 and may expose a portion of the second metal layer M2. The portion of the second metal layer M2 exposed by the passivation layer PAS may determine the shape of the first bonding pad 211 when viewed in plan view. The passivation layer PAS may be formed of an insulating material such as a polyimide-based material and may be provided in a single layer or a plurality of layers.

The protection portion PT may be disposed between the semiconductor substrate SB1 and the first metal layer M1. The protection portion PT may be provided to reduce physical impact applied to the semiconductor substrate SB1 and other components disposed on the same level as the protection portion PT, when the conductive wires 300 (e. g., FIGS. 1 to 3) are bonded to the second metal layers M2.

The protection portion PT includes a gate conducting layer GP, a metal contact MC, and a third metal layer M3.

A second insulating layer INS2 may be formed on the semiconductor substrate SB1.

The gate conducting layer GP may be disposed on the second insulating layer INS2. The gate conducting layer GP may be formed of a silicon-based material or metal.

A third insulating layer INS3 may be disposed on the gate conducting layer GP.

The third metal layer M3 may be disposed on the third insulating layer INS3. The third metal layer M3 may be formed of metal.

The metal contact MC may pass through the third insulating layer INS3 to be disposed between the gate conducting layer GP and the third metal layer M3. The metal contact MC may be provided in plurality between the gate conducting layer GP and the third metal layer M3 and may rigidly support the third metal layer M3. The metal contact MC may be formed of metal.

A fourth insulating layer INS4 may be disposed between the third metal layer M3 and the first metal layer M1.

The first to fourth insulating layers INS1 to INS4 may be formed of an inorganic insulating material or an organic insulating material.

When the first semiconductor chip 210 includes a non-volatile memory, the protection portion PT may be formed by a process of forming a memory cell array. For example, the third metal layer M3 may be disposed on the same level as the bit line of the memory cell array and may be formed of the same material as the bit line.

Figure 6:
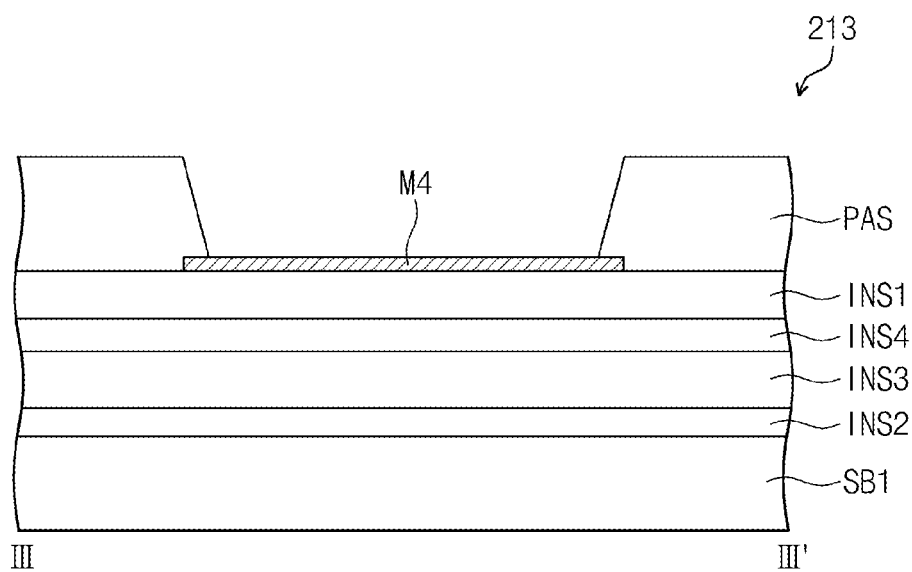
FIG. 6 is a cross-sectional view of a first non-bonding pad taken along line III-III' in FIG. 4.

FIG. 6 is a cross-sectional view of a first non-bonding pad taken along line III-III' in FIG. 4.

At least one of the first non-bonding pads 213 may have such a structure as shown in FIG. 6. In some embodiments, one of the first non-bonding pads 213 may have such a structure as shown in FIG. 6 and another of the first non-bonding pads 213 may have such a structure as shown in FIG. 5. Each first non-bonding pad 213 may not include the protection portion PT, the first metal layer M1, and the via pattern VP, unlike to the first bonding pad 211 as shown in FIG. 5.

For example, the first non-bonding pad 213 may include the fourth metal layer M4 disposed on the semiconductor substrate SB1. The second insulating layer INS2, the third insulating layer INS3, the fourth insulating layer INS4, and the first insulating layer INS1 may be sequentially disposed between the semiconductor substrate SB1 and the fourth metal layer M4. That is, components other than insulating layers may not be disposed between the fourth metal layer M4 and the semiconductor substrate SB1. For example, a metal material and a semiconductor material may not be disposed between the fourth metal layer M4 and the semiconductor substrate SB1.

The fourth metal layer M4 may be disposed on the same level as the second metal layer M2 and may be formed of the same material as the second metal layer M2. That is, the fourth metal layer M4 may be disposed on the first insulating layer INS1. The fourth metal layer M4 may be electrically connected to an integrated circuit in the first semiconductor chip 210 to receive or output a test signal.

A passivation layer PAS may be formed on the fourth metal layer M4 and the first insulating layer INS1 and expose a portion of the fourth metal layer M4. The portion of the fourth metal layer M4 exposed by the passivation layer PAS may determine the shape of the first non-bonding pad 213 when viewed in plan view.

Since the first non-bonding pads 213 having such a structure as shown in FIG. 6 are not bonded to the conductive wires 300, the protection portion PT may not be provided unlike the first bonding pads 211. Also, since the first non-bonding pads 213 having such a structure as shown in FIG. 6 are not bonded to the conductive wires 300, the via pattern VP and the first metal layer M1 as shown in FIG. 5 may also not be provided. According to an embodiment, since the first non-bonding pads 213 having such a structure as shown in FIG. 6 may exclude components other than the fourth metal layer M4, a degree of freedom of wiring design may increase.

Figure 7:
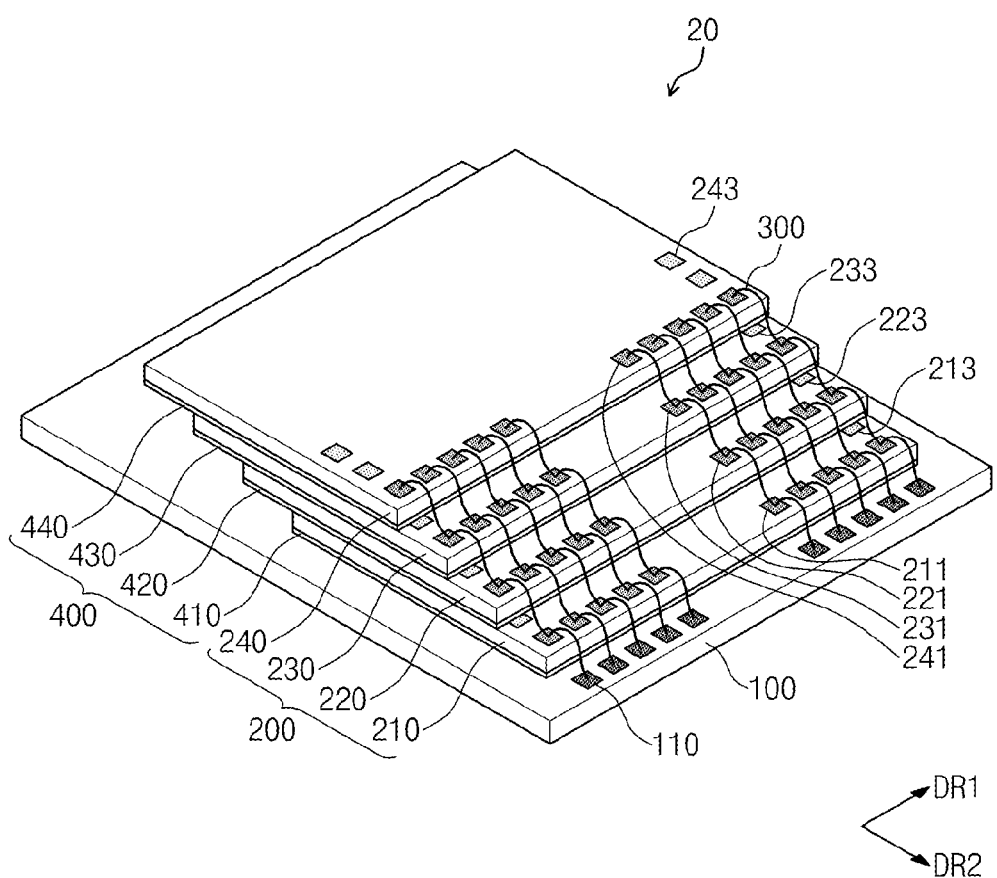
FIG. 7 is a perspective view of a semiconductor package according to an embodiment of the inventive concept.
Figure 8:
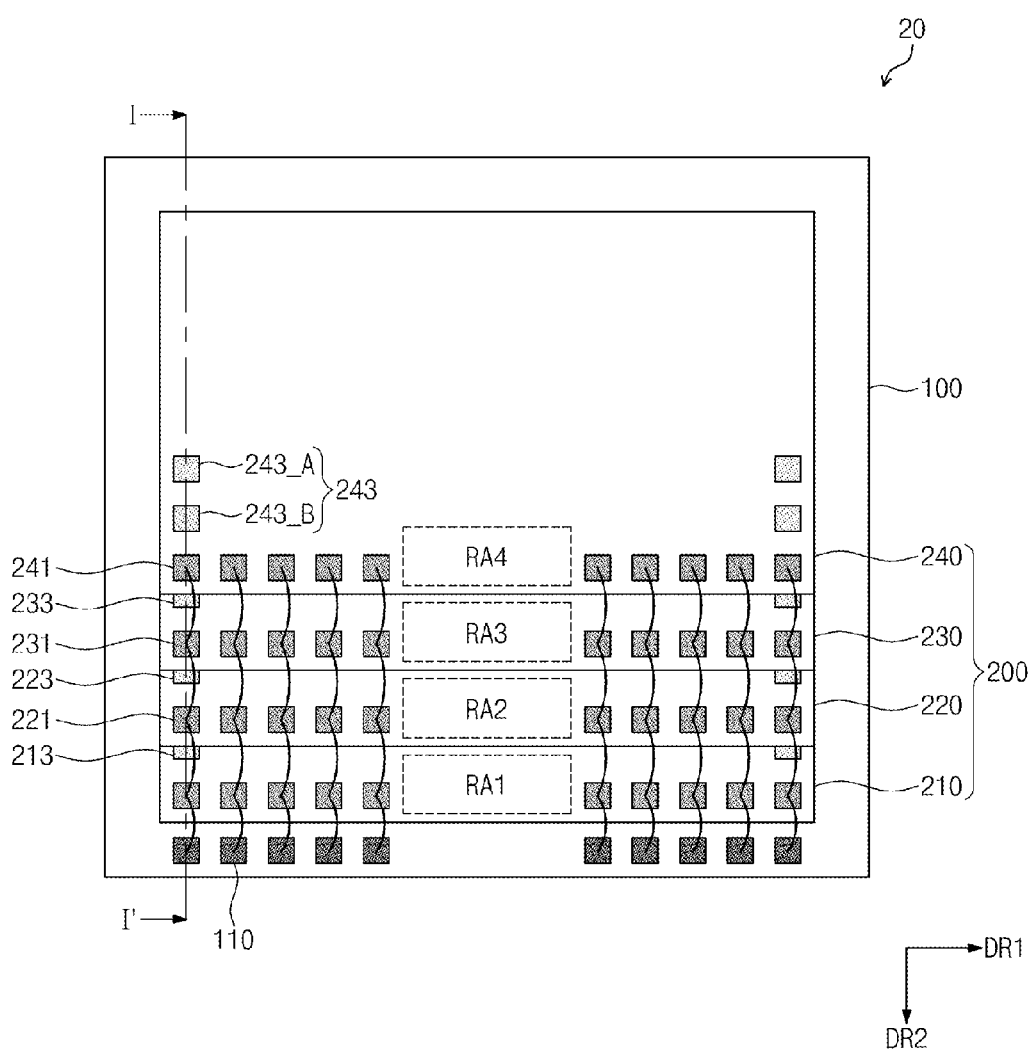
FIG. 8 is a plan view of the semiconductor package of FIG. 7.
Figure 9:
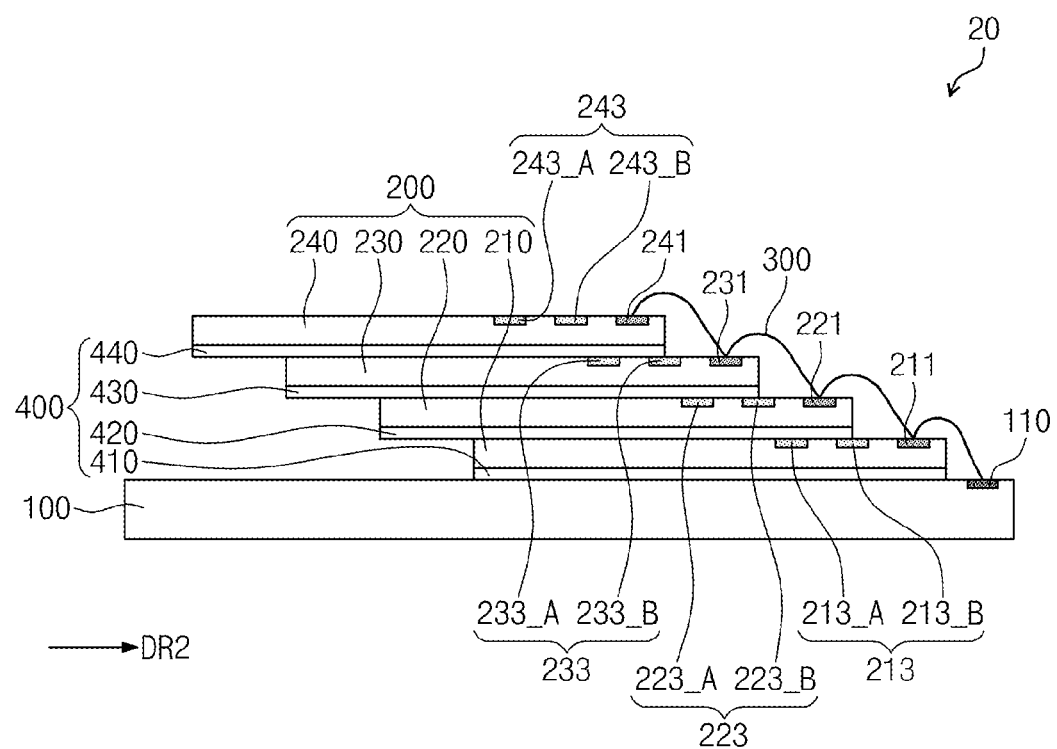
FIG. 9 is a cross-sectional view taken along line I-I' in FIG. 8.

FIG. 7 is a perspective view of a semiconductor package according to an embodiment of the inventive concept, FIG. 8 is a plan view of the semiconductor package of FIG. 7, and FIG. 9 is a cross-sectional view taken along line I-I' in FIG. 8.

A semiconductor package 20 shown in FIGS. 7 to 9 differs in the manner of exposing the first to fourth non-bonding pads 213 to 243 when compared to the semiconductor package 10 shown in FIGS. 1 to 3. Hereinafter, points of distinction between the semiconductor package 20 shown in FIGS. 7 to 9 and the semiconductor package shown in FIGS. 1 to 3 will be primarily described, and reference is to the embodiment described in connection with FIGS. 1 to 3 with respect to any non-described aspects of FIGS. 7 to 9.

Referring to FIGS. 7 to 9, the second semiconductor chip 220 may be disposed on the first semiconductor chip 210. The second semiconductor chip 220 may expose the first bonding pads 211 of the first semiconductor chip 210. The second semiconductor chip 220 may cover a portion of the first non-bonding pads 213 of the first semiconductor chip 210. The second semiconductor chip 220 may expose a portion of the first non-bonding pads 213 of the first semiconductor chip 210.

The first non-bonding pads 213 may include a first internal non-bonding pad 213_A and a first external non-bonding pad 213_B that are spaced apart from each other in the second direction DR2. The first external non-bonding pad 213_B may be disposed between the first internal non-bonding pad 213_A and the first bonding pads 211 in the second direction DR2.

The second semiconductor chip 220 may fully cover the first internal non-bonding pad 213_A and may cover a portion of the first external non-bonding pad 213_B.

Similarly to the first non-bonding pads 213, the second non-bonding pads 223 may include a second internal non-bonding pad 223_A and a second external non-bonding pad 223_B. The third non-bonding pads 233 may include a third internal non-bonding pad 233-A and a third external non-bonding pad 233_B. The fourth non-bonding pads 243 may include a fourth internal non-bonding pad 243_A and a fourth external non-bonding pad 243_B.

The third semiconductor chip 230 may expose the second bonding pads 221. The third semiconductor chip 230 may fully cover the second internal non-bonding pad 223_A and may cover a portion of the second external non-bonding pad 223_B.

The fourth semiconductor chip 240 may expose the third bonding pads 231. The fourth semiconductor chip 240 may fully cover the third internal non-bonding pad 233_A and may cover a portion of the third external non-bonding pad 233_B.

Figure 10:
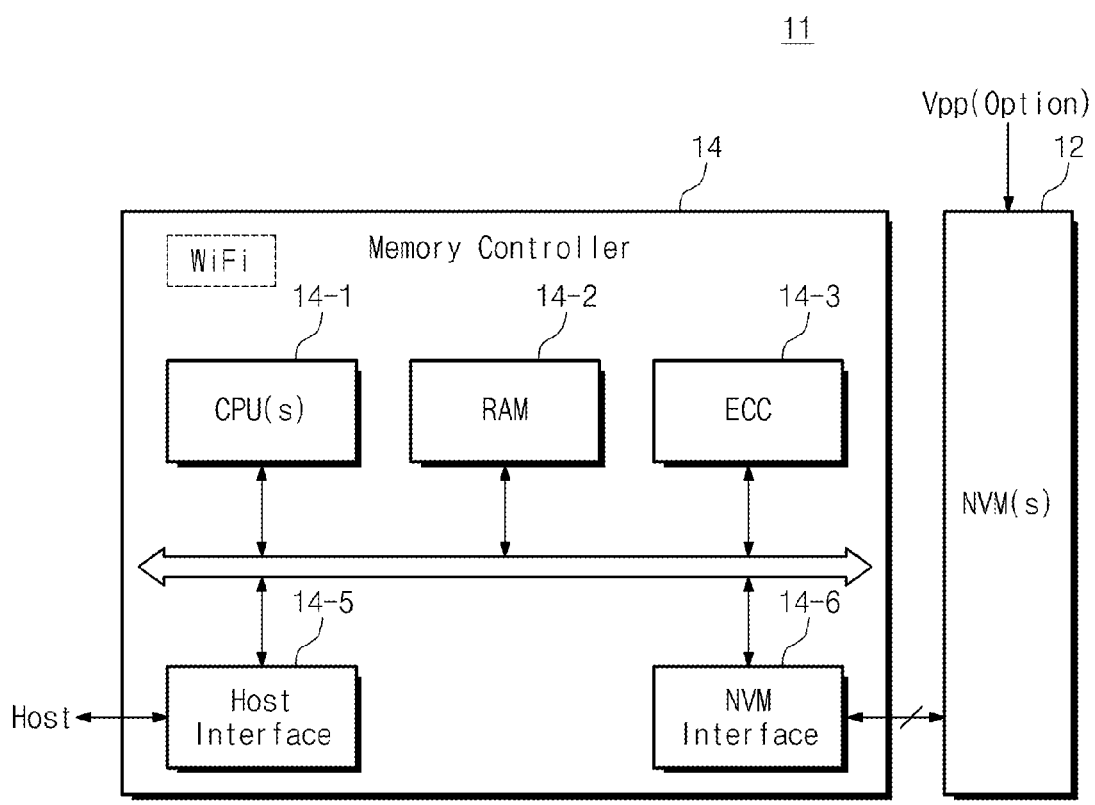
FIG. 10 is an example block diagram of a storage device according to an embodiment of the inventive concept.

FIG. 10 is an example block diagram of a storage device 11 according to embodiments of the inventive concept. Referring to FIG. 10, the storage device 11 includes at least one non-volatile memory device 12 and a memory controller 14 controlling the non-volatile memory device 12. The storage device 11 may be a storage medium, such as a memory card (CF, SD, or micro SD memory card), a USB storage device, or a solid state drive (SSD).

The non-volatile memory device 12 may be implemented in the semiconductor package 10 or 20 according to embodiments of the inventive concept.

The memory controller 14 controls write, read or erase operations for the non-volatile memory device 12 in response to a request from a host. The memory controller 14 includes at least one CPU 14-1, a RAM 14-2, an error correction circuit 14-3, a host interface 14-5, and a non-volatile memory (NVM) interface 14-6.

The CPU 14-1 may control overall operations (such as read, write, file system management, or bad page management) for the non-volatile memory device 12. The RAM 14-2 operates according to the control of the CPU 14-1 and may be used as a work memory, a buffer memory, or a cache memory. When the RAM 14-2 is used as the work memory, data processed by the CPU 14-1 is temporarily stored. When the RAM 14-2 is used as the buffer memory, it is used for buffering data to be transmitted from a host to the non-volatile memory device 12 or from the non-volatile memory device 12 to the host. When the RAM 14-2 is used as the cache memory, the non-volatile memory device 12 operating at a low speed operates at a high speed.

The ECC circuit 14-3 generates an error correction code (ECC) for correcting fail bit or error bit of data received from the non-volatile memory device 12. The ECC circuit 14-3 performs error correction encoding on data provided to the non-volatile memory device 12 to form data to which parity bit is added. The parity bit may be stored in the non-volatile memory device 12. Also, the ECC circuit 14-3 may perform error correction decoding on data output from the non-volatile memory device 12. The ECC circuit 14-3 may correct an error by using parity. The ECC circuit 14-3 may correct an error by using a low density parity check (LDPC) code, a BCH code, a turbo code, a Reed-Solomon code, a convolution code, a recursive systematic code (RSC), and coded modulation, such as trellis-coded modulation (TCM), or block coded modulation (BCM).

The memory controller 14 receives and transmits data from and to a host through the host interface 14-5 and receives and transmits data from and to the non-volatile memory device 12 through the NVM interface 14-6. The host interface 14-5 may be connected to the host through a parallel AT attachment (PATA) bus, a small computer system interface (SCSI), a universal serial bus (USB), peripheral component interconnect express (PCIe), or a NAND interface.

In an embodiment, the memory controller 14 may include a wireless communication function (such as WiFi).

While embodiments have been described in the detailed description of the inventive concept, several variations may be made without departing from the scope of the inventive concept. Therefore, the scope of the inventive concept should not be limited to the above-described embodiments but be defined by the following claims and equivalents thereof.

What is claimed is:

1. A semiconductor package comprising:
    a substrate comprising connection pads;
    a first semiconductor chip stacked on an upper surface of the substrate, wherein the first semiconductor chip comprises a layer of electrically conductive pads constituting bonding pads, a layer of routing wires extending lengthwise in directions parallel to the upper surface of the substrate in a routing area of the first semiconductor chip, and a layer of electrically conductive pads constituting non-bonding pads; and
    conductive wires connected to the bonding pads and the connection pads,
    wherein the bonding pads are arrayed in at least one column along a first side of the first semiconductor chip, the bonding pads in each said column being spaced from each other in a first direction parallel to the upper surface of the substrate,
    the layer of routing wires in the routing area of the first semiconductor chip is located, in the first direction, between respective ones of the bonding pads,
    the non-bonding pads are arrayed in at least one column, the non-bonding pads in each said column thereof being spaced from each other in a second direction parallel to the upper surface of the substrate but different from the first direction,
    the non-bonding pads are not in contact with the conductive wires, and
    the layer of electrically conductive pads constituting the bonding pads, the layer of routing wires, and the layer of electrically conductive pads constituting the non-bonding pads are all disposed at the same level from the substrate.

2. The semiconductor package of claim 1, wherein the non-bonding pads are electrically connected to an integrated circuit in the semiconductor chip to receive or output a test signal for testing the integrated circuit.

3. The semiconductor package of claim 1, further comprising a second semiconductor chip stacked on the first semiconductor chip in a form of a cascade, wherein the second semiconductor chip exposes the bonding pads and covers at least a portion of the non-bonding pads.

4. The semiconductor package of claim 3, wherein each said at least one column of the non-bonding pads comprises:
    an internal non-bonding pad; and
    an external non-bonding pad disposed between the internal non-bonding pad and a respective one of the bonding pads,
    wherein the second semiconductor chip fully covers the internal non-bonding pad and covers a portion of the external non-bonding pad.

5. The semiconductor package of claim 1, further comprising a second semiconductor chip stacked on the first semiconductor chip in a form of a cascade, wherein the second semiconductor chip exposes the bonding pads and fully covers the non-bonding pads.

6. The semiconductor package of claim 1, wherein the non-bonding pads are arrayed in at least one column along a second side of the first semiconductor chip, the second side being substantially perpendicular to the first side of the first semiconductor chip.

7. The semiconductor package of claim 6, wherein the non-bonding pads are also arrayed in at least one additional column along a third side of the first semiconductor chip, the third side being parallel and opposite to the second side of the first semiconductor chip and substantially perpendicular to the first side of the first semiconductor chip.

8. The semiconductor package of claim 1, wherein each of the electrically conductive pads constituting the bonding pads is a first metal layer, and each of the bonding pads further comprises a second metal layer disposed on the first metal layer, and a via pattern electrically connecting the first metal layer to the second metal layer.

9. The semiconductor package of claim 8, wherein each of the bonding pads further comprises a protection portion disposed under the first metal layer, and the protection portion comprises a gate conducting layer, a third metal layer disposed on the gate conducting layer, and a metal contact connecting the gate conducting layer to the third metal layer.

10. The semiconductor package of claim 8, wherein the electrically conductive pad of each of at least one of the non-bonding pads is a fourth metal layer, the fourth metal layer is of a same material as the second metal layer and disposed at the same level as the second metal layer, and a metal material is not disposed under the fourth metal layer.

11. The semiconductor package of claim 1, wherein the first semiconductor chip further comprises:
    a memory cell area in which a non-volatile memory is disposed; and a peripheral circuit area in which circuits for operating the non-volatile memory are disposed.

12. The semiconductor package of claim 11, wherein the bonding pads and the non-bonding pads are disposed in the peripheral circuit area.

13. The semiconductor package of claim 11, the non-volatile memory is a vertical NAND (VNAND) flash memory including memory cells that are vertically stacked on one another to form a three-dimensional cell array structure.

14. A semiconductor package comprising:
a substrate comprising connection pads;
a first semiconductor chip stacked on the substrate, wherein the first semiconductor chip comprises bonding pads, non-bonding pads, and routing wires in a routing area of the first semiconductor chip adjacent to a center of an edge of the first semiconductor chip; and
conductive wires connected to the bonding pads and the connection pads,
wherein the bonding pads are arrayed in at least one column in a direction parallel to the edge of the first semiconductor chip,
the routing wires in the routing area of the first semiconductor chip are located, in the first direction, between respective ones of the bonding pads,
the routing area is devoid of electrically conductive pads such that there is no overlap of the array of bonding pads with the routing area, and
the non-bonding pads are not connected to the conductive wires and are arrayed in at least one column in a direction which is different from that of the at least one column of the bonding pads.

15. The semiconductor package of claim 14, wherein the non-bonding pads are test pads dedicated to receive or output a test signal.

16. The semiconductor package of claim 14, wherein the first semiconductor chip has a quadrilateral shape having sides extending in a first direction and a second direction perpendicular to the first direction and the edge of the first semiconductor chip is one of the sides extending in the first direction.

17. The semiconductor package of claim 16, wherein the non-bonding pads are arrayed along the sides of the first semiconductor extending in the second direction.

18. The semiconductor package of claim 14, wherein no conductors run from the first semiconductor chip in the routing area to the substrate externally of the first semiconductor chip and the substrate.

19. A semiconductor package comprising:
a substrate comprising connection pads;
a first semiconductor chip stacked on the substrate, wherein the first semiconductor chip comprises a first routing area that is provided adjacent a center of an edge of the first semiconductor chip and in which a routing wiring is disposed, first bonding pads that are disposed to form at least one column in a first direction extending along the edge and that have no overlap with the first routing area, and first non-bonding pads that are disposed to form a column different from the at least one column formed by the first bonding pads;
a second semiconductor chip stacked on the first semiconductor chip in a form of a cascade; and
conductive wires connected to the first bonding pads and the connection pads,
wherein the second semiconductor chip exposes the first bonding pads and the first routing area, and the second semiconductor chip exposes a portion of the first non-bonding pads or fully covers the first non-bonding pads, and
the second semiconductor chip comprises a second routing area that is provided adjacent a center of the edge of the semiconductor chip and in which a second routing wiring is disposed, second bonding pads that are disposed to form at least one column in the first direction and to have no overlap with the second routing area, and second non-bonding pads that are disposed to form a column different from the at least one column formed by the second bonding pads.

20. The semiconductor package of claim 19, wherein the first non-bonding pads are not connected to the conductive wires and are test pads dedicated to receive or output a test signal for testing an integrated circuit.

* * * * *